(12) United States Patent
Bahl

(10) Patent No.: US 7,724,484 B2
(45) Date of Patent: May 25, 2010

(54) ULTRA BROADBAND 10-W CW INTEGRATED LIMITER

(75) Inventor: Inder Jit Bahl, Roanoke, VA (US)

(73) Assignee: Cobham Defense Electronic Systems Corporation

( * ) Notice: Subject to any disclaimer, the term of this patent is extended or adjusted under 35 U.S.C. 154(b) by 336 days.

(21) Appl. No.: 11/618,369

(22) Filed: Dec. 29, 2006

(65) Prior Publication Data

US 2008/0157896 A1   Jul. 3, 2008

(51) Int. Cl.
  H02H 3/20 (2006.01)
  H02H 9/04 (2006.01)
(52) U.S. Cl. .................... 361/56; 361/111; 361/91.1
(58) Field of Classification Search .......... 361/56, 361/111, 91.1
  See application file for complete search history.

(56) References Cited

U.S. PATENT DOCUMENTS

| | | | |
|---|---|---|---|
| 2,470,307 A | 5/1949 | Guanella | |
| 3,244,998 A | 4/1966 | Broadhead, Jr. | |
| 3,273,098 A | 9/1966 | Saito | |
| 3,428,886 A | 2/1969 | Kawashima et al. | |
| 3,443,030 A * | 5/1969 | Sato et al. | 178/70 R |
| 3,678,418 A | 7/1972 | Woodward | |
| 3,846,721 A | 11/1974 | Fritz et al. | |
| 3,944,943 A | 3/1976 | Reed | |
| 3,965,445 A | 6/1976 | Ou | |
| 3,990,024 A | 11/1976 | Hou | |
| 3,991,390 A | 11/1976 | Conroy | |
| 3,997,852 A | 12/1976 | Schornack et al. | |
| 4,125,810 A | 11/1978 | Pavio | |
| 4,160,961 A | 7/1979 | Bory et al. | |
| 4,203,073 A * | 5/1980 | Rae et al. | 455/224 |
| 4,260,963 A | 4/1981 | Drapac | |
| 4,275,364 A | 6/1981 | Skatvold, Jr. | |
| 4,305,043 A | 12/1981 | Ho et al. | |
| 4,311,974 A | 1/1982 | Reddy | |
| 4,375,054 A | 2/1983 | Pavio | |

(Continued)

OTHER PUBLICATIONS

Lee, Area Efficient and Symmetric Design of Monolithic Transformers for Silicon RF IC's. 1999 IEEE TENCON.*

(Continued)

*Primary Examiner*—Stephen W Jackson
*Assistant Examiner*—Zeev Kitov
(74) *Attorney, Agent, or Firm*—Jaeckle, Fleischmann & Mugel, LLP

(57) ABSTRACT

The invention provides a novel broadband power limiter having improved frequency characteristics and power capacity, suitable for use with GaAs low-noise amplifier circuits. The power limiter includes a shunt diode circuit and two impedance transformers. The first transformer is a step-down impedance transformer connected between the shunt diode circuit and the input to the limiter, and the second transformer is a step-up impedance transformer connected between the shunt diode circuit and the output of the limiter. The invention further provides a method for limiting the power of an input signal, comprising the steps of: transforming the input signal from the input impedance to an intermediate impedance; shunting a portion of the input signal to ground; and transforming a remaining portion of the input signal from the intermediate impedance to an output impedance. The invention further provides a novel impedance transformer suitable for use in the broadband power limiter and a method for providing such an impedance transformer.

27 Claims, 9 Drawing Sheets

U.S. PATENT DOCUMENTS

| | | |
|---|---|---|
| 4,460,877 A | 7/1984 | Sterns |
| 4,495,505 A | 1/1985 | Shields |
| 4,554,518 A | 11/1985 | Baer |
| 4,621,242 A | 11/1986 | Theall, Jr. et al. |
| 4,647,877 A | 3/1987 | Thompson |
| 4,661,997 A * | 4/1987 | Roberts et al. ............... 455/327 |
| 4,788,509 A | 11/1988 | Bahl et al. |
| 4,839,616 A | 6/1989 | Herzog |
| 4,999,597 A | 3/1991 | Gaynor |
| 5,008,639 A | 4/1991 | Pavio |
| 5,014,018 A | 5/1991 | Rodwell et al. |
| 5,015,972 A | 5/1991 | Cygan et al. |
| 5,025,232 A | 6/1991 | Pavio |
| 5,061,910 A | 10/1991 | Bouny |
| 5,093,639 A | 3/1992 | Franchi et al. |
| 5,119,048 A | 6/1992 | Grunwell |
| 5,140,288 A | 8/1992 | Grunwell |
| 5,157,361 A | 10/1992 | Gruchalla et al. |
| 5,173,671 A | 12/1992 | Wendler et al. |
| 5,200,719 A | 4/1993 | Margulis et al. |
| 5,216,393 A | 6/1993 | Wandel |
| 5,262,740 A | 11/1993 | Willems |
| 5,304,959 A | 4/1994 | Wisherd et al. |
| 5,304,961 A | 4/1994 | Dydyk |
| 5,352,994 A | 10/1994 | Black et al. |
| 5,425,167 A * | 6/1995 | Shiga et al. ................... 29/606 |
| 5,430,895 A | 7/1995 | Huusko |
| 5,436,601 A | 7/1995 | Mandai et al. |
| 5,497,137 A | 3/1996 | Fujiki |
| 5,534,830 A | 7/1996 | Ralph |
| 5,557,138 A | 9/1996 | Ikeda et al. |
| 5,563,551 A | 10/1996 | Kashiwa |
| 5,574,411 A | 11/1996 | Apel et al. |
| 5,619,172 A | 4/1997 | Reynolds |
| 5,628,057 A | 5/1997 | Phillips et al. |
| 5,640,132 A | 6/1997 | Ralph |
| 5,644,272 A | 7/1997 | Dabrowski |
| 5,697,088 A | 12/1997 | Gu |
| 5,751,201 A | 5/1998 | Pavio |
| 5,767,754 A | 6/1998 | Menna |
| 5,773,887 A | 6/1998 | Pavio et al. |
| 5,774,026 A | 6/1998 | Cunin et al. |
| 5,808,518 A | 9/1998 | McKinzie, III et al. |
| 5,818,313 A | 10/1998 | Estes et al. |
| 5,834,994 A | 11/1998 | Shapiro |
| 5,880,646 A | 3/1999 | Vannatta et al. |
| 5,945,890 A | 8/1999 | McCorkle |
| 5,949,304 A | 9/1999 | Heine et al. |
| 6,087,907 A | 7/2000 | Jain |
| 6,097,273 A | 8/2000 | Frye et al. |
| 6,147,582 A | 11/2000 | Goldsmith et al. |
| 6,188,306 B1 | 2/2001 | Wollesen |
| 6,263,198 B1 | 7/2001 | Li |
| 6,278,340 B1 | 8/2001 | Liu |
| 6,289,204 B1 | 9/2001 | Estes et al. |
| 6,377,125 B1 | 4/2002 | Pavio et al. |
| 6,380,821 B1 | 4/2002 | Imbornone et al. |
| 6,396,362 B1 | 5/2002 | Mourant et al. |
| 6,407,647 B1 | 6/2002 | Apel et al. |
| 6,433,640 B1 | 8/2002 | Pavio et al. |
| 6,455,925 B1 * | 9/2002 | Laureanti ..................... 257/678 |
| 6,483,396 B1 * | 11/2002 | Kwon et al. ................. 333/108 |
| 6,483,415 B1 | 11/2002 | Tang |
| 6,556,099 B2 | 4/2003 | Khan et al. |
| 6,590,469 B1 | 7/2003 | Patel |
| 6,603,383 B2 | 8/2003 | Gevorgian et al. |
| 6,614,307 B1 | 9/2003 | Zhao et al. |
| 6,627,507 B2 | 9/2003 | Yuan |
| 6,636,126 B1 | 10/2003 | Pozdeev |
| 6,653,911 B2 | 11/2003 | Estes et al. |
| 6,664,606 B2 | 12/2003 | Estes |
| 6,664,868 B1 | 12/2003 | Echols, Jr. |
| 6,664,935 B1 | 12/2003 | Thompson et al. |
| 6,683,510 B1 | 1/2004 | Padilla |
| 6,714,095 B2 | 3/2004 | Pavio et al. |
| 6,724,079 B2 | 4/2004 | Viswanathan et al. |
| 6,737,932 B2 | 5/2004 | Killen et al. |
| 6,750,652 B2 | 6/2004 | Weyers et al. |
| 6,756,874 B2 | 6/2004 | Buckles et al. |
| 6,765,469 B2 | 7/2004 | Sortor |
| 6,882,240 B2 | 4/2005 | Apel |
| 2003/0193376 A1 | 10/2003 | Estes et al. |
| 2004/0130396 A1 | 7/2004 | Chen |

OTHER PUBLICATIONS

Ko et al., 20 Ghz Integrated CMOS Frequency Sources with Quadrature VCO using Transformers. IEEE Radio Frequency Integrated Circuits Symposium, 2004.*

Kuphaldt, Lessons in Electric Circuits, 2000, www.allaboutcircuits.com, 6th Ed, V.II-AC.*

Ashman, Michael et al., High Performance Wideband MSAG Gain Block/Driver Amplifier MMICs Using MLP Technology, Microwave Jourrnal.

Bahl, Inder J. et al., Characteristics of Inhomogenous Broadside-Coupled Striplines, IEEE Transactions on Microwave Theory and Techniques, Jun. 1980, 529-535, vol. MTT-28, No. 6.

Bahl, Inder J. et al., Multifunction SAG Process for High-Yield, Low-Cost GaAs Microwave Integrated Circuits, IEEE Transactions on Microwave Theory and Techniques, Sep. 1990, 1175-1182, vol. 38, No. 9.

Bahl, Inder J. 10W CW Broadband Balanced Limiter/LNA Fabricated Using MSAG MESFET Process, May 20, 2002, 118-127, 2003 Wiley Periodicals, Inc.

Bahl, Inder J. et al., The Design of Broadside -Coupled Stripline Circuits, IEEE Transactions on Microwave Theory and Techniques, Feb. 1981, 165-168, vol. MTT-29, No. 2.

Becciolini, B. Impedance Matching Networks Applied to RF Power Transistors, Motorola, 1993, 1-15.

Carpentieri, Enzo, Model Characterizes Transmission-Line Transformers, Microwaves & RF, Nov. 1996, 73-80.

Engels, M et al., Design Methodology Measurement and Application of MMIC Transmission Line Transformers, IEEE MTT-S Digest, 1995, 1635-1638.

Garg, Ramesh et al., Characteristics of Coupled Microstriplines, IEEE Transactions on Microwave Theory and Techniques, Jul. 1979, 700-705, vol. MTT-27, No. 7.

Geissberger, Arthur E. et al., A New Refractory Self-Aligned Gate Technology for GaAs Microwave Power FET's and MMIC's, IEEE Transactions on Electron Devices, May 1988, 615-622, vol. 35, No. 5.

Kulke, Reinhard et al., LTCC-Multilayer Ceramic for Wireless and Sensor Applications, 1-8.

Liu, Shih-Ping, Planar Transmission Line Transformer Using Coupled Microstrip Lines, IEEE MTT-S Digest, 1998, 789-792.

Looney, Jim et al, An Examination of Recovery Time of an Integrated Limiter/LNA, IEEE Microwave magazine, Mar. 2004, 83-85.

M/A-COM, RF Directional Couplers and 3dB Hybrids Overview, 10-5-10-14, M560 V2.00.

M/A-COM, RF Balun Transformers, 10-25-10-28, M565 V2.00.

M/A-COM, High Performance Wideband Amplifiers For Radar and Satcom Applications, Microwave Journal, 2004.

MacDonald, Michael, Design Broadband Passive Components With Ferrites, Microwaves & RF, Oct. 1993, 81-86, 132.

McClure, Donald A., Broadband Transmission Line Transformer Family Matches a Wide Range of Impedances, RF Transformers, Feb. 1994, 62-66.

Rotholz, Ersch, Transmission-Line Transformers, IEEE Transactions on Microwave Theory and Techniques, Apr. 1981, 327-331, vol. MTT-29, No. 4.

Sevick, Jerry, Transmission Line Transformers, American Radio Relay League, Newington, CT.

Sevick, Jerry, A Simplified Analysis of the Broadband Transmission Line Transformer, High Frequency Electronics, Feb. 2004, 48-53, Summit Technical Media LLC.

Singh, Hausila, A GaAs X-Band Multifunction Control MMIC Using the Msag Process, Microwave Product Digest, Aug. 2003.

Willems, David, An MMIC-Compatible Tightly Coupled Line Structure Using Embeded Microstrip, IEEE Transactions on Microwave Theory and Techniques, Dec. 1993, 2303-2310, vol. 41, No. 12.

* cited by examiner

4:1 TRANSFORMER

4:1 TRANSFORMER

9:1 TRANSFORMER

600

9:4 TRANSFORMER

700

ULTRA BROADBAND 10-W CW INTEGRATED LIMITER

FIELD OF THE INVENTION

The present invention relates to a limiter for use in microwave communication systems.

BACKGROUND OF THE INVENTION

Monolithic microwave integrated circuits ("MMICs") are widely used in commercial and military microwave systems. Due to the fine geometry used in MMIC transistors, these circuits are susceptible to damage from high-power spurious electromagnetic radiation, e.g., from microwave transmitters or nuclear electromagnetic pulses. In particular, low-noise amplifiers ("LNAs") in the front-end of such microwave systems need high-power protection because these amplifiers can typically sustain only input power levels in the range of 10 to 20 dBm for a continuous-wave ("CW") input signal, or from 1 to 3 µJ for a pulsed input signal. For this reason, many radar, electronic warfare ("EW"), navigation and communication systems require ultra broadband high power limiters with low insertion loss, fast recovery time and low leakage output power. At present, however, no broadband 10-W CW limiter product is available that is capable of working over a 2-20 GHz frequency band.

Existing broadband limiter products are typically capable of handling only about one to three watts of CW power, and have a high insertion loss of about 2 dB, a long recovery time of about 1000 ns (or about 1 µs) and a high leakage output power of about 20 dBm. To protect highly sensitive MMIC circuits, however, a high power limiter with less than 0.3 dB insertion loss is needed. Moreover, it is desirable for the power limiter technology to be compatible with existing LNA technology (typically GaAs), so that the limiter circuit may be integrated onto the same GaAs chip as the LNA circuit. Finally, good broadband performance of the limiter is also a requirement in order to cover the frequency range of operation.

SUMMARY OF THE INVENTION

Briefly described, the invention provides a novel broadband power limiter having improved frequency characteristics and power capacity, suitable for use with GaAs low-noise amplifier circuits. Like conventional power limiters, the broadband power limiter of the invention is based on one or more shunt diodes connected between a signal line to be protected and ground. The broadband power limiter in accordance with the invention, however, further includes two impedance transformers—a step-down impedance transformer at the input of the limiter (before the one or more shunt diodes) and a step-up impedance transformer at the output of the limiter (after the one or more shunt diodes).

Thus, in a first aspect, the invention provides a power limiter for limiting the power of an input signal, comprising: an input terminal capable of receiving the input signal; an output terminal; a shunt diode circuit; a first impedance transformer connected between the shunt diode circuit and the input terminal; and a second impedance transformer connected between the shunt diode circuit and the output terminal.

In another aspect, the invention provides a method for limiting the power of an input signal having an input impedance. The method comprises the steps of: transforming the input signal from the input impedance to an intermediate impedance; shunting a portion of the input signal to ground; and transforming a remaining portion of the input signal from the intermediate impedance to an output impedance.

In yet another aspect, the invention provides an impedance transformer, comprising a first node, a second node, a ground node, and a rectangular array of at least four conductors connected between the first node, the second node, and the ground node, wherein each conductor in the array is electromagnetically coupled to each other conductor in the array by at least one of side-coupling and broadside coupling.

In still another aspect, the invention provides a method for providing an impedance transformer, comprising providing a first node, providing a second node, providing a ground node, and providing a rectangular array of at least four conductors connected between the first node, the second node, and the ground node, wherein each conductor in the array is electromagnetically coupled to each other conductor in the array by at least one of side-coupling and broadside coupling.

These and other features of the invention will be more fully understood by references to the following drawings.

DETAILED DESCRIPTION

Figure 1:
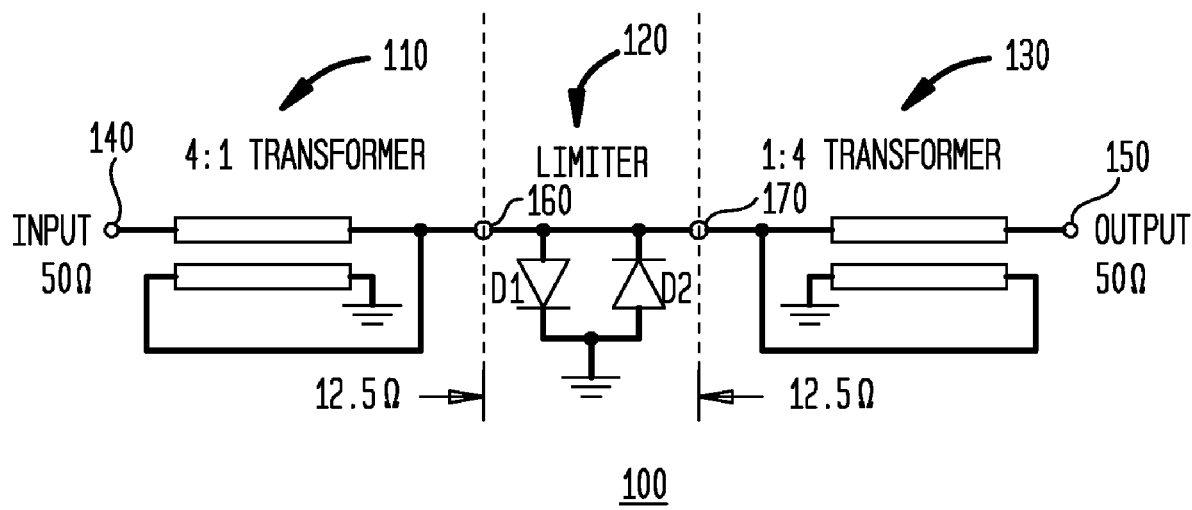
FIG. 1 is a diagram of an ultra broadband 10-W limiter in accordance with the present invention.

FIG. 1 shows an embodiment of a broadband power limiter in accordance with the invention. This ultra broadband high power limiter can handle greater than 10 watts of CW power and may be monolithically integrated on GaAs substrate as a stand-alone product or with low noise amplifier manufactured using existing multi-function self-aligned gate processes (e.g., M/A-COM's MSAG® process).

With reference to FIG. 1, the broadband power limiter 100 comprises: a first broadband impedance transformer 110 connected to the input terminal 140 for transforming the input impedance from a first impedance (e.g., 50 ohms or 75 ohms) to an intermediate impedance lower than the first (e.g., 12.5 ohms or 18.75 ohms); a limiter circuit 120 including one or more shunt diodes D1, D2; and a second broadband impedance transformer 130 for transforming the intermediate impedance to an output impedance at the output terminal 150. The first broadband impedance transformer 110 is preferably a step-down impedance transformer providing a 4:1 impedance transformation, while the second broadband impedance transformer 130 is preferably a step-up impedance transformer providing a 1:4 impedance transformation. It should be understood, however, that other impedance transformer ratios (e.g., 9:4 step-down and 4:9 step-up transformer ratios, or 9:1 step-down and 1:9 step-up transformer ratios) and input impedance levels other than 50 ohms and 75 ohms may also be used.

Because the shunt diodes D1, D2 in the broadband power limiter of the invention are connected at the lower-impedance node between the two impedance transformers, the shunt diode reactance-to-line impedance ratio (X/L) is much larger than in existing limiters. As a result, correspondingly larger-area, high-capacitance (and low-reactance) shunt diodes may be used in the power limiter, providing a greatly improved capacity to pass shunt current, as well as an improved frequency pass band (e.g., about 2 GHz to about 20 GHz). In addition, because the impedance transformers may be made from integrated components, the broadband power limiter of the present invention may be monolithically integrated, either alone as a stand-alone product, or with other circuit components such as a low-noise amplifier.

Figure 2:
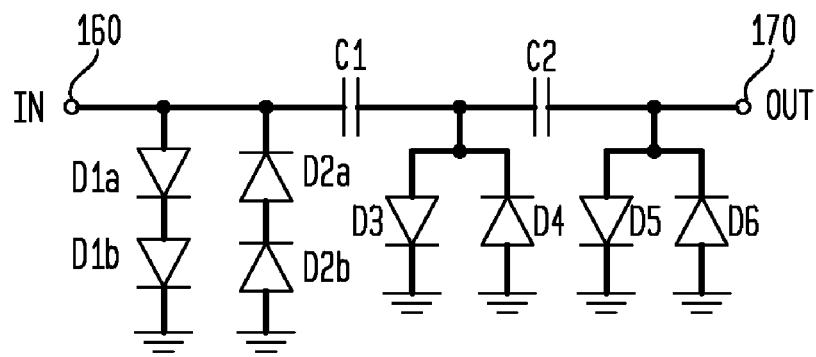
FIG. 2 is a diagram of a 3-stage Schottky limiting diode configuration suitable for use in the ultra broadband 10-W limiter of FIG. 14.

The limiter circuit 120 is preferably a 3-stage Schottky diode limiter as shown in FIG. 2. It contains a first stage of large Schottky limiting diodes D1a, D1b, D2a and D2b capable of handling up to about 40 dBm of input power, while the second stage of smaller Schottky limiting diodes D3 and D4 limits the leakage power below about 20 dBm and the third stage of still smaller Schottky limiting diodes to limit the leakage power below about 14 dBm. The diodes D1a, D1b, D2a and D2b in the first stage preferably form a series combination of two sets of diodes (a first set including D1a and D1b and a second set including D2a and D2b). The two sets of diodes are preferably in antiparallel configuration, so that both halves of an RF input signal are clipped or limited. The limiting diodes in the second and third stages are likewise placed in an antiparallel configuration. For matching purposes, capacitors C1 and C2 are preferably located between each stage of the 3-stage limiter circuit.

Each of impedance transformers 110, 130 may be a impedance transformer based on a ladder network or on a transmission line transformer (TLT) having straight or coiled sections of inter-connected transmission lines. The use of a TLT is generally preferable over a ladder-network transformer, in order to provide multi-octave impedance transformation at RF frequencies and at the low end of the microwave frequencies. Further, where the input signal is an unbalanced or single-ended signal (e.g., as shown in FIG. 1), impedance transformers 110, 130 are preferably single-ended (a.k.a. unbalanced) transformers.

Figure 3:
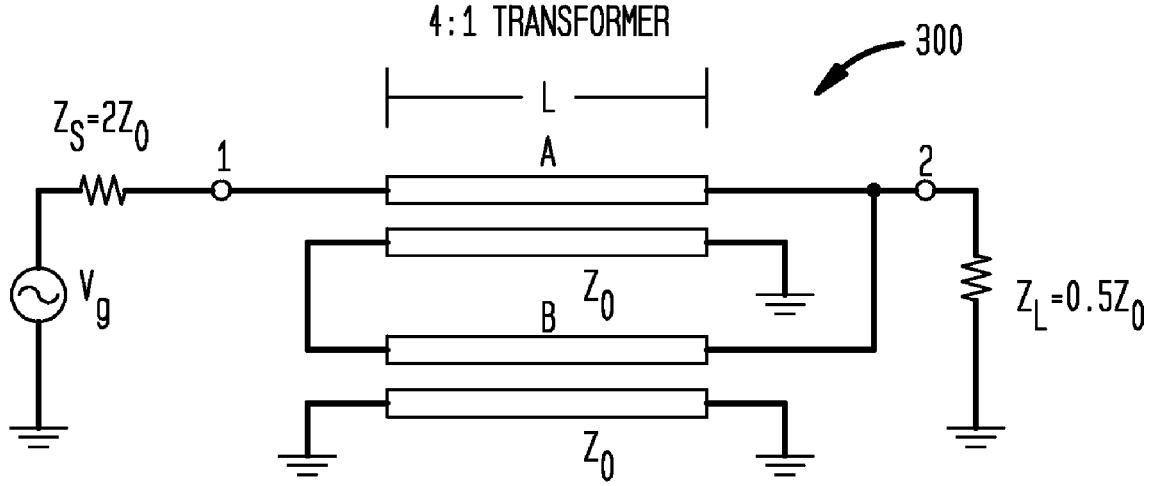
FIG. 3 is a diagram depicting an impedance transformer configuration using uncoupled transmission lines suitable for use in the present invention.

FIG. 3 shows an example of a non-coupled 4:1 TLT 300 suitable for use in the invention. In FIG. 3, the source impedance ZS is equal to four times the load impedance ZL. In such a TLT, transmission lines A and B are typically not electromagnetically coupled, and their length L is typically selected to be equal to one-quarter of the wavelength ($\lambda$/4). Such a transformer, however, requires a relatively large area on a substrate or printed circuit.

Figure 4:
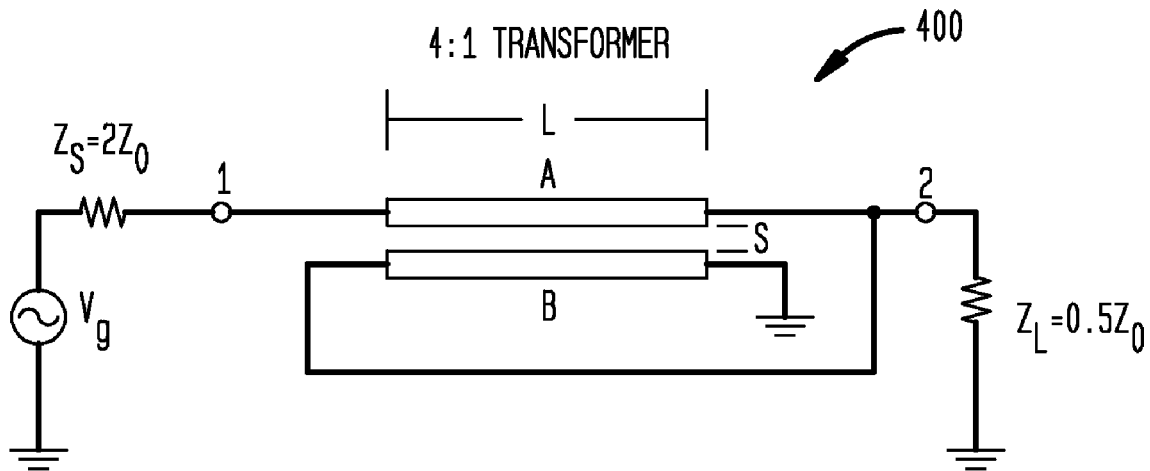
FIG. 4 is a diagram depicting an impedance transformer configuration using coupled microstrip suitable for use in the present invention.

FIG. 4 depicts a preferred embodiment of a 4:1 impedance transformer 400 suitable for use in the present invention. The transformer 400 preferably comprises two conductors A and B (having a width W and a length L) that are electromagnetically coupled (either side-coupled or broadside-coupled). The input (node 1) to the impedance transformer 400 is taken at a first end of conductor A. The other end of conductor A is connected to the output node (node 2) and to the first end of conductor B, while the other end of conductor B is connected to ground. As such, a current passing through conductor A from node 1 toward node 2 induces a current to flow in conductor B that is opposite in polarity to the current ordinarily tending to flow from node 2 through conductor B to ground. As a result, a 4:1 impedance transformation is obtained from as few as two parallel conductors.

Figure 5:
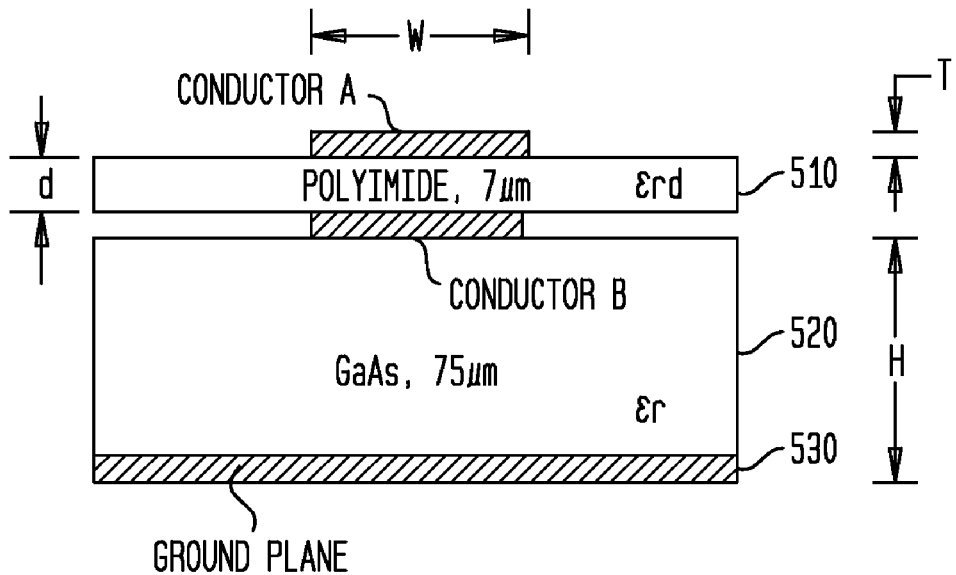
FIG. 5 is a cross-sectional view of a broadside-coupled impedance transformer suitable for use in the present invention.

FIG. 5 depicts a cross-section of a broadside-coupled 4:1 microstrip impedance transformer 400 suitable for use in the invention. Such an impedance transformer advantageously may be implemented on a GaAs substrate using existing multi-level MMIC process technology. In broadside-coupled microstrip lines, the coupling coefficient is very large, because both electric and magnetic couplings are present. As a result, the broadside coupled impedance transformer 400 has an excellent bandwidth and a small size (e.g., length L in FIG. 4 is approximately equal to $\lambda$/8). As shown in FIG. 5, the conductor connected to the input node (conductor A) is preferably positioned above the conductor connected to ground (conductor B) and separated from it by a polyamide layer 510 of about 7 µm. In turn, the conductor connected to ground (conductor B) is preferably positioned between the conductor connected to the input node (conductor A) and the ground plane 530, and separated from ground by a GaAs layer 520 of about 75 µm. Conductors A and B are preferably microstrip lines of gold or a high-conductivity metal or alloy and are preferably about 4.5 µm thick.

Figure 6:
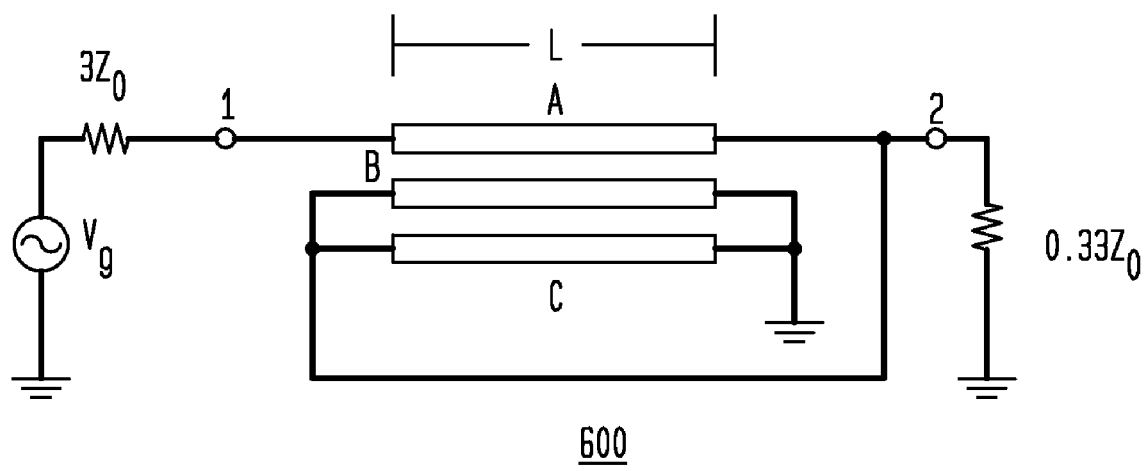
FIG. 6 is a diagram depicting a 9:1 transformer configuration suitable for use in the present invention.

FIG. 6 depicts an embodiment of a 9:1 impedance transformer 600 that is also suitable for use in the present invention. Like transformer 400, the 9:1 impedance transformer 600 preferably comprises two conductors A and B (having a width W and a length L) that are electromagnetically coupled (by side coupling or broadside coupling) to each other. Unlike impedance transformer 400, however, the 9:1 impedance transformer 600 further includes a third conductor C that is electromagnetically coupled (by side coupling or broadside coupling) to conductors A and B. In the 9:1 impedance transformer 600, the input is received at a first end of conductor A (node 1 in FIG. 6). The other end of conductor A is connected to the output node (node 2) and to the first end of conductor B and the first end of conductor C. The other ends of conductor B and conductor C are connected to ground. In this 9:1 transformer configuration, the current passing through conductor A from node 1 toward node 2 induces currents to flow in both conductor B and conductor C that are opposite in polarity to the current ordinarily tending to flow from node 2 through conductor B and conductor C to ground. As a result, a 9:1 impedance transformation is obtained from as few as three parallel conductors. It will be understood that a cross-section of the 9:1 impedance transformer 600 is similar to that of the 4:1 impedance transformer 400 shown in FIG. 5, except that the additional conductor C is inserted between conductor B and the GaAs layer 520 and separated from conductor B by an additional layer of polyimide (not shown).

Figure 7:
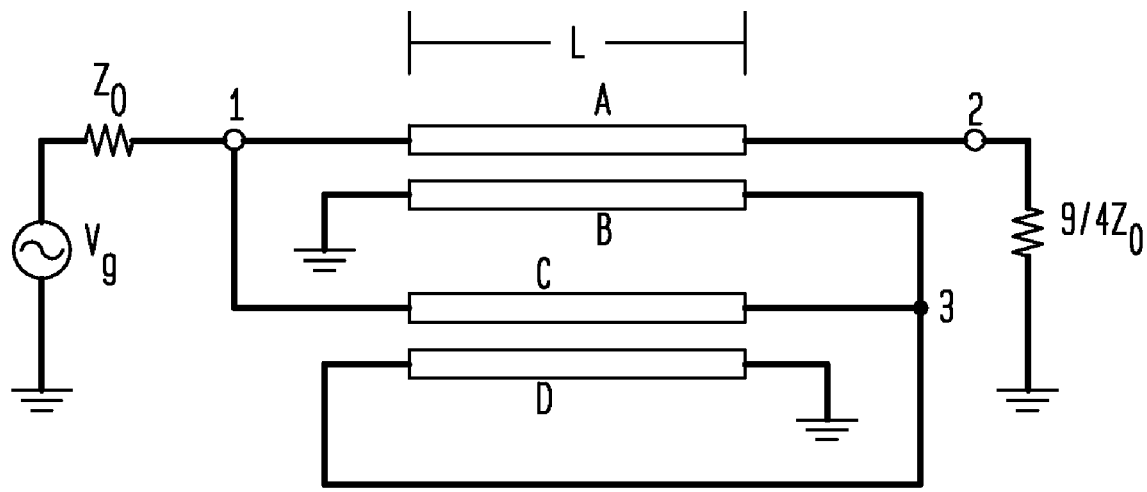
FIG. 7 is a diagram depicting a coupled 9:4 impedance transformer configuration suitable for use in the present invention.

FIG. 7 depicts an embodiment of a coupled 9:4 impedance transformer 700 that is also suitable for use in the present invention. Like transformers 400, the 9:4 impedance transformer 700 preferably comprises two conductors A and B (having a width W and a length L) that are electromagnetically coupled (by side coupling or broadside coupling) to each other. The 9:4 impedance transformer further comprises a pair of conductors C and D (also having width W and length L) that are electromagnetically coupled (by side coupling or broadside coupling) to conductors A and B. In the 9:4 impedance transformer 700, the input is received at a first node (node 1 in FIG. 7), which is connected to a first end of conductor A and to a first end of conductor C. The second end of conductor A is connected to a second node (node 2). The second end of conductor C is connected via node 3 to a first end of conductor B (in antiparallel configuration to conductor A) and to a first end of conductor D (in parallel configuration to conductor C). Finally, both the second end of conductor B and the second end of conductor D are connected to ground.

Figure 8:
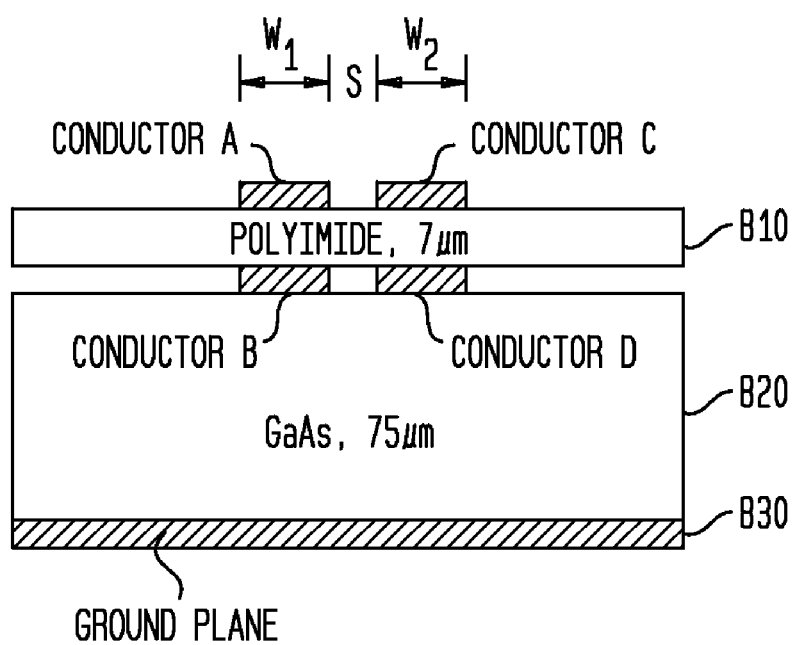
FIG. 8 is a cross-sectional view of the coupled 9:4 impedance transformer of FIG. 7.

FIG. 8 depicts a cross-section of the coupled 9:4 microstrip impedance transformer 700 suitable for use in the invention. As shown in FIG. 8, the two conductors connected to the first node (conductors A and C) are preferably positioned adjacent to one another in a side-coupled configuration, and separated by a distance S that is small enough to provide a positive (non-zero) coupling coefficient between conductors A and C (e.g., between about 5 and 10 μm). Further, each of conductors A and C is positioned above its respective complementary conductor (conductors B and D, respectively), in a broadside-coupled configuration, and separated from its respective complementary conductor by a polyamide layer 810 of about 7 μm. In turn, the complementary conductors B and D are preferably positioned between conductors A and C and the ground plane 830, and separated from ground by a GaAs layer 820 of about 75 μm. Conductors A, B, C and D thus are arranged in a rectangular array that is two conductors by two conductors in size.

In this 9:4 transformer configuration, due to the close proximity of conductors A, B, C and D, both of the currents passing through conductor A from node 1 toward node 2 and through conductor C from node 1 toward node 3 advantageously (a) induce current to flow in conductor B that is opposite in polarity to the current ordinarily tending to flow from node 3 through conductor B to ground, and (b) further induce current to flow in conductor D that is the same in polarity to the current ordinarily tending to flow in conductor D. As a result of the current splitting that occurs at node 1 as well as at node 3, and as a further result of the various effects of the anti-parallel current flow through conduct B and the parallel current flow through conductors A, C and D, a 9:4 impedance transformation is obtained. Further, because conductors A, B, C and D are in such close proximity, the resulting coupling coefficients are very large. As a result, the coupled 9:4 impedance transformer 700 has an excellent bandwidth and a small size (e.g., length L in FIG. 7 is approximately equal to λ/8).

In practice, broadside-coupled TLTs are difficult to design accurately using conventional circuit simulators, because the substrate and the conductors are of multilayer type. However, the inventor has determined that accurate solutions can be obtained by using an electromagnetic simulator, e.g., the em™ high-frequency electromagnetic software available from Sonnet Software, Inc. Suitable substrate parameters for the 4:1 impedance transformer 400, the 9:1 impedance transformer 600 and the 9:4 impedance transformer 700 are given in Table 1 below.

TABLE 1

Substrate parameters for broadband impedance transformers.

Figure 9:
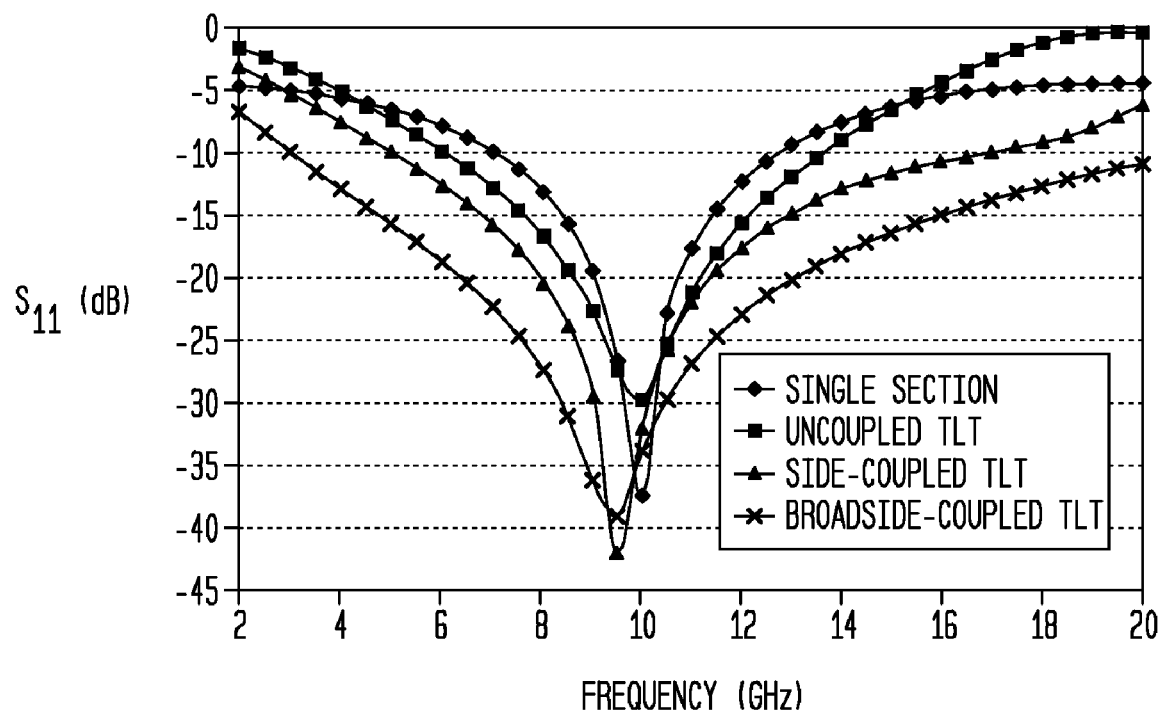
FIG. 9 is a graph showing the reflection coefficient response of four types of 4:1 transformers.
Figure 10:
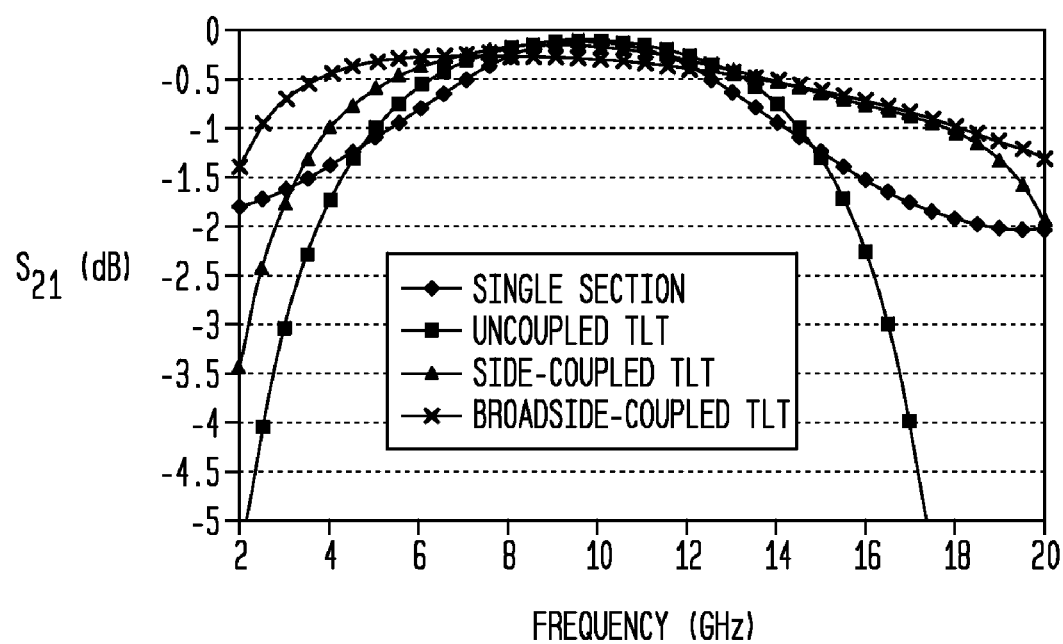
FIG. 10 is a graph showing the transmission coefficient response of four types of 4:1 transformers.

GaAs Substrate, $\epsilon_r$ = approximately 12.9
Substrate Thickness, h = approximately 75 μm
Polyimide, $\epsilon_{rd}$ = approximately 3.2
Polyimide Thickness, d = approximately 7 μm
Gold Conductors thickness, T = approximately 4.5 μm For the sake of comparison, the inventor simulated four microstrip 50-ohm-to-12.5-ohm (4:1) transformer configurations, including a single-section TLT, a TLT having non-coupled conductors, a TLT having side-coupled conductors, and a TLT having broadside-coupled lines. For these transformers, FIGS. 9 and 10 show the simulated reflection and transmission coefficients versus frequency, respectively. For these simulations, the input node for each TLT (node 1 in FIGS. 3 and 4) was terminated in a 50-ohm source load $Z_S$ and the output port (port 2 in FIGS. 3 and 4) was terminated in a 12.5-ohm load $Z_L$.

Table 2 below compares the simulated bandwidths of these four microstrip transformer configurations for three cases of return loss: 10, 15 and 20 dB. The bandwidth of a transformer is defined in terms of return loss RL i.e. the frequency range over which the return loss RL is equal or greater the specified value. The fractional bandwidth FBW is defined as below:

$$FBW = \frac{\Delta f}{f_0} \tag{1}$$

$$\Delta f = f_h - f_l, f_0 = \sqrt{f_l f_h} \tag{2}$$

where $f_l$ and $f_h$ are the low and high end of the frequency band, and $f_0$ is the center frequency as defined above. It will be recognized that although the simulated examples are for a real 50-ohm impedance to a real 12.5-ohm impedance, the broadside-coupled TLT may also be used to transform a complex impedance to real impedance or vice versa as well as complex to complex impedance. It may be seen from the simulated results shown in Table 2 below that among these four transformers, the broadside-coupled TLT provided the largest bandwidth and had the shortest line length.

TABLE 2

Bandwidth comparison of 4:1 impedance transformers: 50 Ω to 12.5 Ω

| Configuration | Performance | | |
|---|---|---|---|
| | Return Loss dB | $f_0$ (GHz) | FBW % |
| Single Section Microstrip | 20 | 9.86 | 16.1 |
| W = 190 μm, L = 2500 μm | 15 | 9.77 | 31.3 |
| | 10 | 9.47 | 61.3 |

TABLE 2-continued

Bandwidth comparison of 4:1 impedance transformers: 50 Ω to 12.5 Ω

| Configuration | Performance | | |
|---|---|---|---|
| | Return Loss dB | $f_0$ (GHz) | FBW % |
| Uncoupled Microstrip Lines | 20 | 9.81 | 26.4 |
| W = 200 μm, L = 2500 μm | 15 | 9.61 | 47.9 |
| | 10 | 9.07 | 83.8 |
| Coupled Microstrip Lines | 20 | 9.50 | 36.8 |
| W = 130 μm, S = 20 μm, L = 2300 μm | 15 | 9.35 | 67.0 |
| | 10 | 9.25 | 130.9 |
| Broadside-Coupled Microstrip Lines | 20 | 9.13 | 72.6 |
| W = 20 μm, d = 7 μm, L = 1400 μm | 15 | 8.74 | 130.0 |
| | 10 | 8.01 | 227.5 |

The overall die area required by microstrip-based TLTs may be further reduced by folding the lines in a coil or loop shape, because the line width is much narrower than the length, especially in the broadside-coupled TLT. Further, by cascading two sections of 4:1 transformers in series, a 50-ohm input impedance may be matched to a 3.1-ohm output impedance over very large bandwidths.

Figure 11:
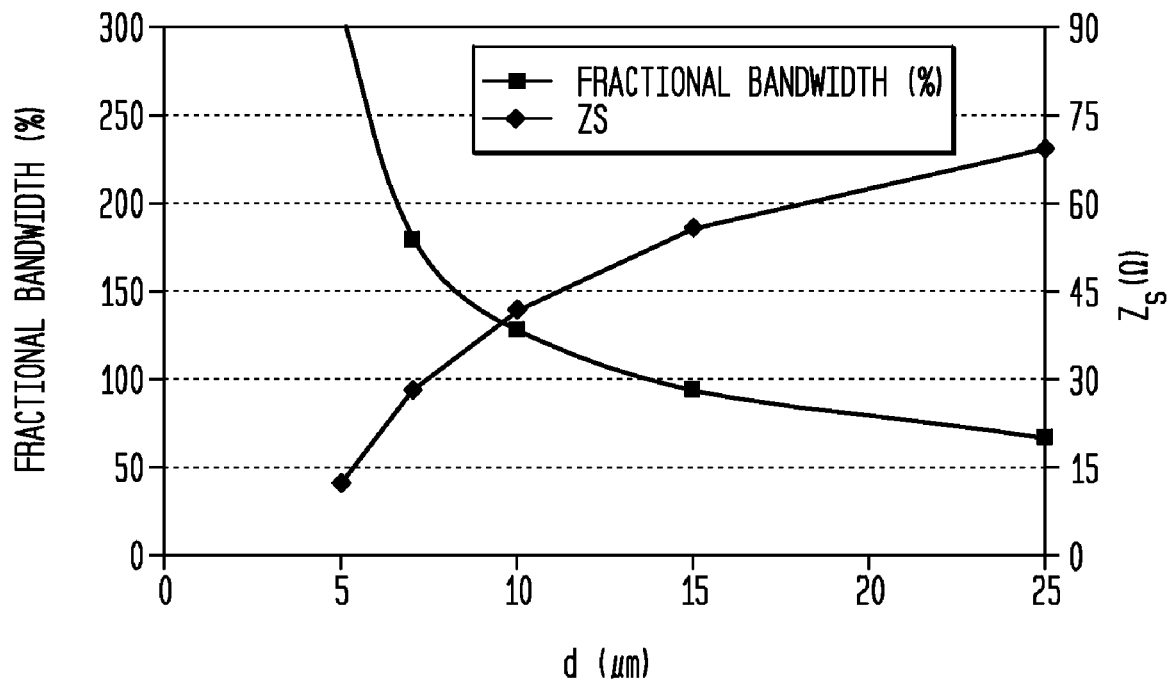
FIG. 11 is a graph showing the maximum fractional bandwidth and source impedance of a 4:1 TLT versus polyimide thickness.

Various structural parameters for broadside-coupled TLTs for use in the present invention have been studied. In particular, the effect of polyimide thickness d in FIG. 5 on the bandwidth of a broadside-coupled 4:1 TLT was studied by simulations that varied the polyimide thickness while other parameters were kept constant. The microstrip width and length were 30 μm and 1400 μm, respectively. FIG. 11 shows the maximum fractional bandwidth ("FBW") and corresponding source impedance of a 4:1 broadside-coupled TLT as a function of polyimide thickness between the two broadside-coupled conductors. It was found that as the polyimide thickness d was increased from 5 μm to 25 μm, the FBW decreased logarithmically from about 300% to about 20%, and the source impedance increased asymptotically from about 13 ohms to about 68 ohms. It may be seen from FIG. 11 that the tight coupling between the broadside-coupled conductors A and B results in larger bandwidth and lower source impedance.

The inventor also simulated the effect of the microstrip width of conductors A and B in FIG. 5 on the optimum source impedance to be matched and the corresponding bandwidth of a broadside-coupled TLT. Table 3 below gives the approximate fractional bandwidth for 4:1 transformers having various approximate microstrip widths. The substrate parameters are given in Table 1 above. The line length in this case is about 1400 μm. In Table 3, $Z_S$ is the source impedance shown in FIG. 4, and W is the microstrip width. It may be observed that as the microstrip width was decreased, or the characteristic impedance was increased, the bandwidth decreased. Thus, it may be seen that to match 50 ohm to 12.5 ohm, a line width of about 15 μm (yielding a characteristic impedance of 74 ohms) is needed, and the resultant fractional bandwidth is about 130%.

TABLE 3

Maximum bandwidth as a function of line width for several TLTs where $Z_S$ is the source impedance and the load impedance $Z_L = Z_S/4$. RL = 15 dB

| Line Width W (μm) | $Z_S$ (Ω) | Frequency Range (GHz) | Center Frequency, $f_0$ (GHz) | Fractional Bandwidth, FBW (%) |
|---|---|---|---|---|
| 10 | 60 | 7-21 | 12.1 | 115.5 |
| 20 | 40 | 5-20 | 10.0 | 150.0 |
| 40 | 23 | 3.5-20 | 8.37 | 197.2 |
| 60 | 16 | 3.0-20 | 7.75 | 219.5 |
| 80 | 12 | 2.5-20 | 7.07 | 247.5 |
| 100 | 10.5 | 2.1-20 | 6.48 | 276.2 |
| 120 | 8.0 | 2.0-20 | 6.32 | 284.6 |

Figure 12:
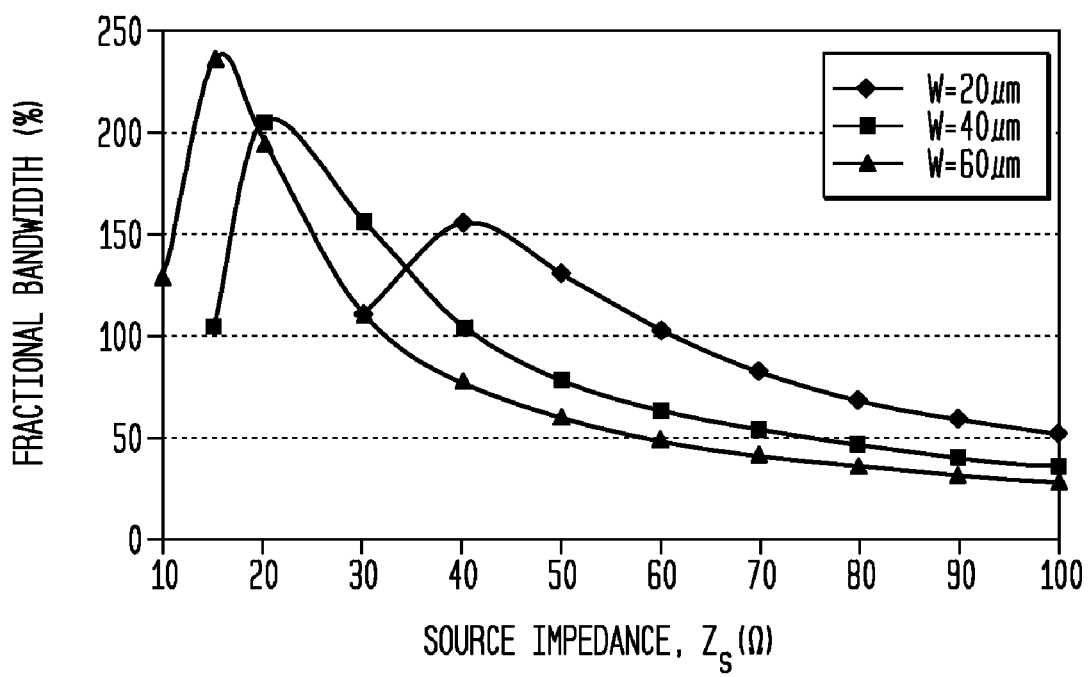
FIG. 12 is a graph showing the fractional bandwidth of a 4:1 TLT as a function of source impedance.

The fractional bandwidth of a broadside-coupled 4:1 TLT as a function of source impedance of the TLT was also calculated for three microstrip widths: 20, 40 and 60 μm. The calculated values are shown in FIG. 12. It may be observed that for each microstrip width there is a maximum FBW and it decreases for other impedance values.

Because polyimide has about 20 times the thermal resistance of GaAs (0.2 W/m-° C. for polyimide versus approximately 4.6 W/m-° C. for GaAs), it has be determined that there is a risk of thermal burnout of passive elements under high power conditions. (See, e.g., I. J. Bahl, "Average Power Handling Capability of Multilayer Microstrip Lines", Int. J. RF and Microwave Computer-Aided Engineering, Vol. 11, pp. 385-395, November 2001.) Thus, to ensure the reliable operation of the broadside-coupled TLT for high power limiter applications, the broadside-coupled TLT should preferably be thermally modeled.

Figure 13:
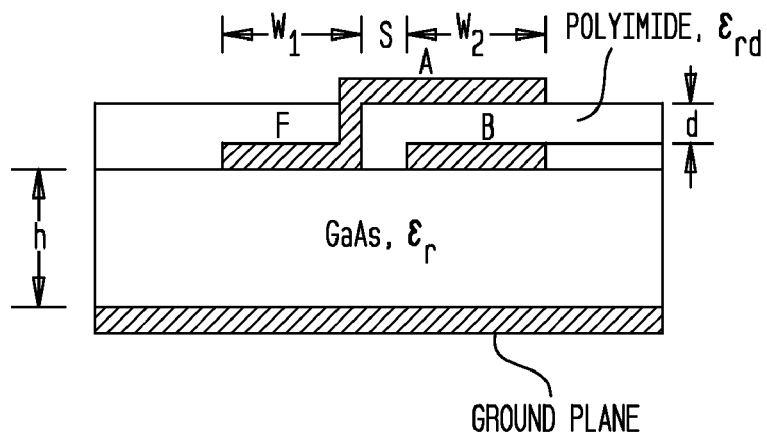
FIG. 13 is a cross-sectional view of a high-power embodiment of the 4:1 TLT in accordance with the present invention.
Figure 14:
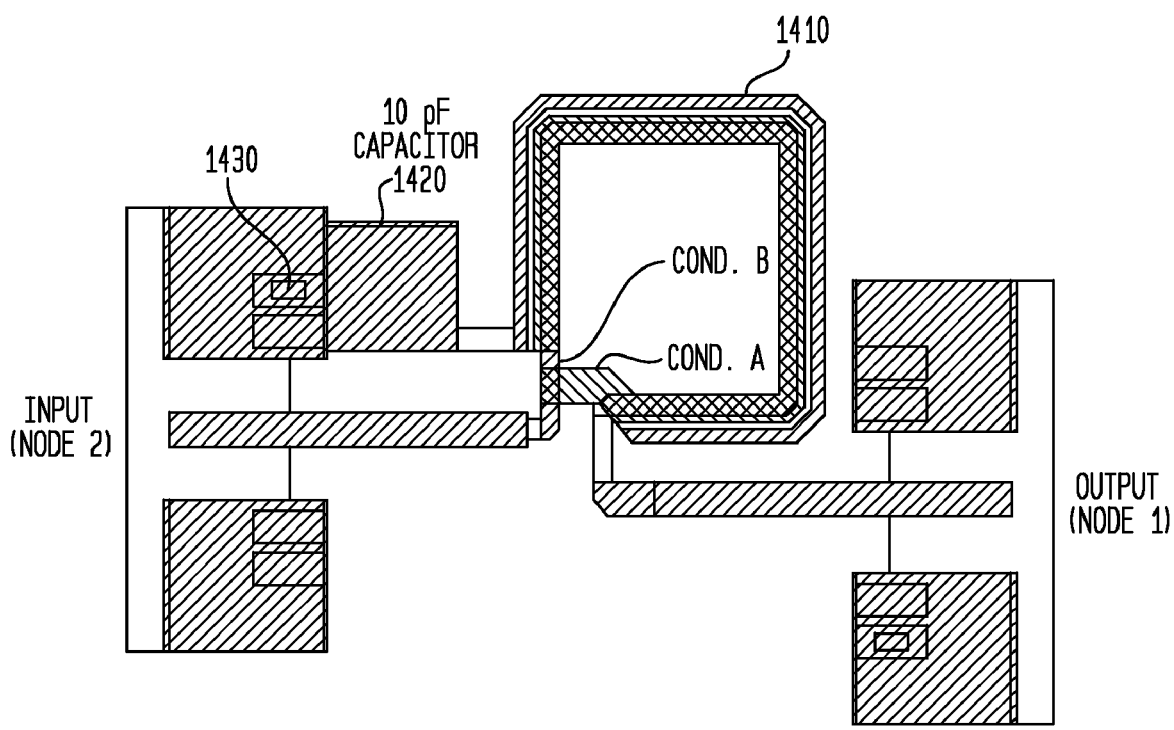
FIG. 14 is a plan view of a layout for the high-power embodiment of the 4:1 TLT depicted in FIG. 13.

FIGS. 13 and 14 depict an alternative embodiment of a high-power 4:1 TLT suitable for use with the present invention that is capable of operating at higher power levels than the embodiment shown in FIG. 5. The cross-sectional view of the modified asymmetric broadside-coupled microstrip is shown in FIG. 13. In the high-power 4:1 TLT, a portion of the upper conductor A is extended to include a flange F having width $W_1$. The flange F thermally connects the uppermost portion $W_2$ of conductor A directly to the GaAs substrate, and thereby serves as a heat sink through which a high amount of heat may be dissipated.

Since conductors A and B are thermally in direct contact with the GaAs substrate, the average power handling capability ("APHC") is not compromised by the small distance d between conductors A and B that is preferable in order to achieve tight coupling. The average power handling capability of such transformers is approximately the same as other microstrip lines having similar line and substrate parameters.

FIG. 14 shows an exemplary layout of a high-power 1:4 broadside-coupled TLT 1410 suitable for use in the present invention. Since this transformer is a part of an active circuit, a dc block capacitor 1420 is preferably connected between the transformer and the via hole 1430 that runs to the ground plane. A value of the capacitor of about 10 pF is preferably used to presents a short circuit at the selected operating frequencies. It is anticipated that, under ideal conditions, the proposed structure may be able to handle power levels on the order of 500 watts CW. The design parameters for the high-power TLT 1410 are $W_1$=about 30 μm, $W_2$=about 30 μm, S=about 10 μm and L=about 1500 μm.

The high-power 1:4 TLT of FIGS. 13 and 14 may be fabricated using any suitable multilayer MMIC fabrication process, such as that described by M. Ashman and I. Bahl in "High Performance Wideband MSAG® Gain Block/Driver Amplifier MMICs Using MLP Technology," Microwave J., vol. 47, pp. 74-88, December 2004, which is hereby incorporated by reference in its entirety. The MSAG® MLP (multi-level plating) process provides a polyimide thickness of about 7 μm, a GaAs substrate thickness tolerance of about ±5 μm, and polyimide tolerances of about ±1 μm in thickness and about ±0.1 in the dielectric constant value.

Figure 15:
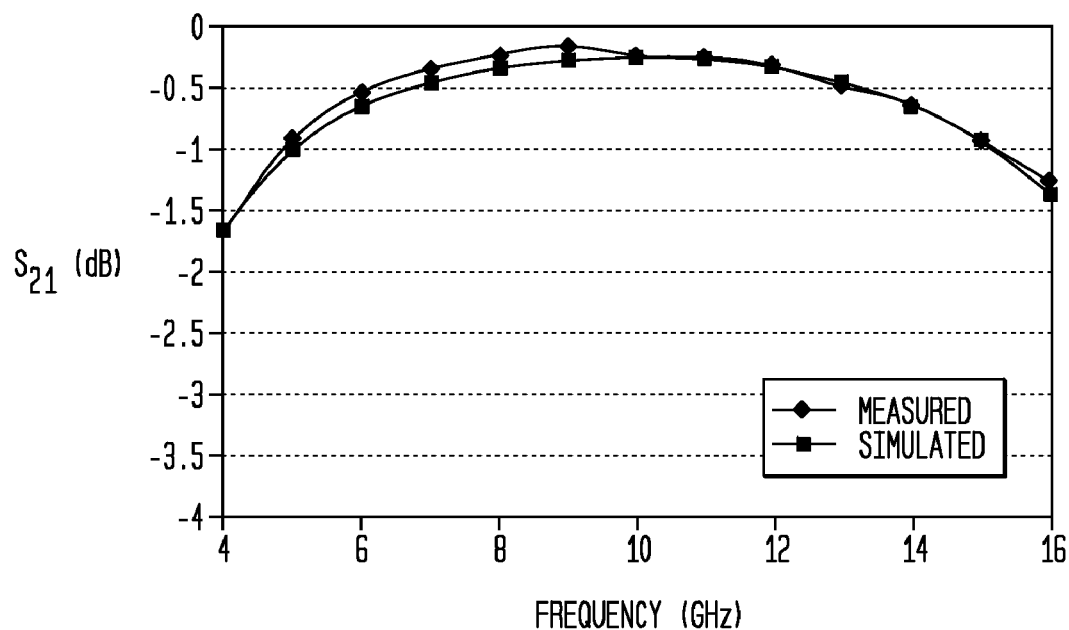
FIG. 15 is a graph showing measured and simulated S21 performance of the high-power embodiment of the 4:1 TLT depicted in FIG. 13.
Figure 16:
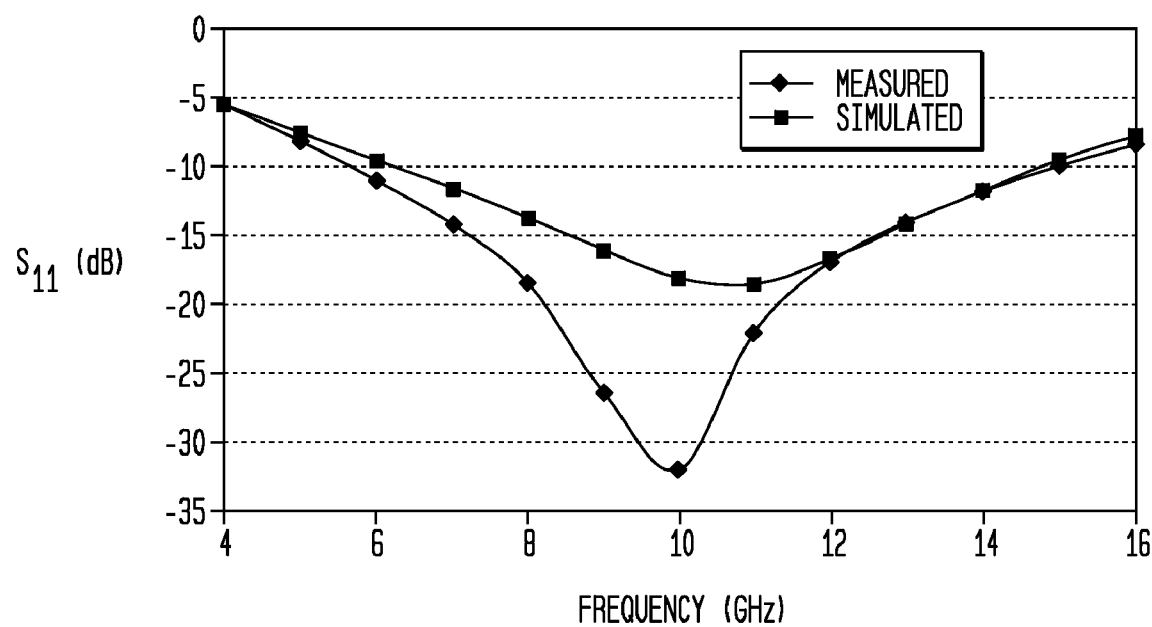
FIG. 16 is a graph showing measured and simulated S11 performance of the high-power embodiment of the 4:1 TLT depicted in FIG. 13.

Exemplary embodiments of the high-power 1:4 TLT of FIGS. 13 and 14 were fabricated and tested on-wafer using RF probes and conventional TRL ("Thru-Reflect-Line") de-embedding techniques. FIGS. 15 and 16 depict the simulated and measured small-signal S21 and S11 performance of the transformer, respectively. The transformers were also tested as a function of input power using high power sources. Several chips were assembled on gold-plated Elkonite (Cu—W alloy) carriers with 50-ohm input and output microstrip feed lines printed on 15-mil alumina substrate. The test fixtures were fitted with high performance microstrip to coaxial connectors having return loss greater than 20 dB up to 18 GHz. The low impedance port was connected to a tuner to match to 50 ohm. No change in the insertion loss was measured with input power level of up to 15 W CW.

Returning to the limiter of the present invention, and based on the high-power 1:4 TLT described above, the inventor has successfully designed and simulated a broadband high-power (e.g., 10-watt CW) limiter in accordance with the invention, using the MSAG® MLP process on 3-mil-thick GaAs substrate. The width $W_2$ of conductors A and B are preferably about 40 μm and about 1400 μm, respectively.

Figure 17:
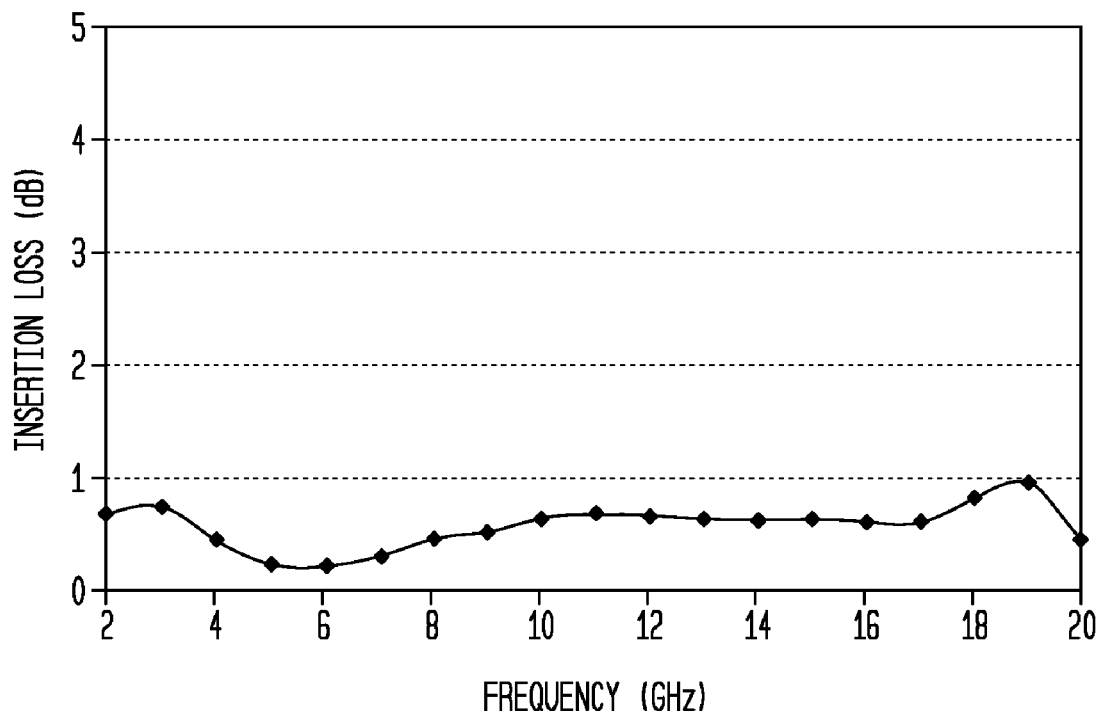
FIG. 17 is a graph showing the simulated insertion loss versus frequency for the broadband limiter of the present invention.
Figure 18:
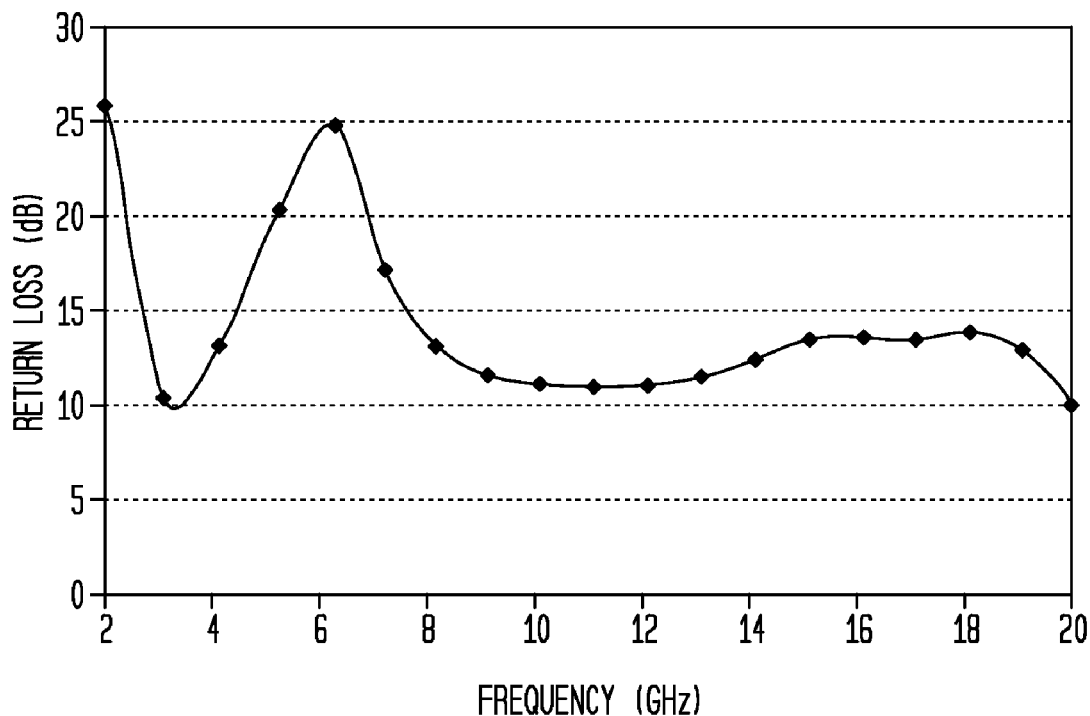
FIG. 18 is a graph showing the simulated return loss versus frequency for the broadband limiter of the present invention.

The high-power limiter of the present invention provides excellent electrical characteristics. FIGS. 17 and 18 show the simulated insertion loss and the simulated return loss for the 10-W limiter in accordance with the invention. In particular, the insertion loss shown in FIG. 17 is less than about 1 dB over the frequency range from about 2 GHz to about 20 GHz. The simulated return loss shown in FIG. 18 is better than about 10 dB. At the input power level of 10-W CW, the leakage power at the output is less than about 14 dBm.

The high-power limiter of the present invention may advantageously be integrated on the same monolithic integrated circuit (MMIC) with a conventional GaAs-based low-noise amplifier. The recovery time for a 10-W high-power limiter with an integrated LNA may be calculated to be on the order of about 35 ns (based on conventional recovery time calculations such as those described by J. Looney, D. Conway and I. Bahl in "An Examination of Recovery Time of an Integrated Limiter/LNA," IEEE Microwave Magazine, Vol. 5, pp. 83-86, March 2004). By comparison, conventional PIN diode limiters typically have a recovery time of approximately a microsecond (1 μs). Moreover, because the present invention may be implemented as a passive device without a biasing network, it may be expected that the recovery time will be even faster than about 35 ns.

Although the invention has been described in language specific to various structural features and/or methodological acts, it is to be understood that the invention defined in the appended claims is not necessarily limited to the specific features or acts described. Rather, the specific features and acts described above are disclosed as exemplary forms of implementing the invention claimed below.

What is claimed is:

1. A power limiter for limiting the power of an input signal, comprising:
   (a) an input terminal capable of receiving the input signal;
   (b) an output terminal;
   (c) a step-down impedance transformer connected to the input terminal for reducing impedance;
   (d) a step-up impedance transformer connected to the output terminal for increasing impedance; and
   (e) a diode limiter connected to ground and between said step-down impedance transformer and said step-up impedance transformer.

2. The power limiter of claim 1, wherein the diode limiter includes one or more diode stages, wherein each stage includes a forward-biased diode connected to ground and a reverse-biased diode connected to ground.

3. The power limiter of claim 1, wherein the step-down and step-up impedance transformers are single-ended transformers.

4. The power limiter of claim 1, wherein the step-down impedance transformer is an n:1 transformer and the step-up impedance transformer is a 1:n transformer, wherein n is one of 4 and 9.

5. The power limiter of claim 4, wherein the step-down impedance transformer transforms a 50-ohm input impedance to a 12.5-ohm impedance and the step-up impedance transformer transforms the 12.5-ohm impedance to a 50-ohm output impedance.

6. The power limiter of claim 4, wherein the step-down impedance transformer transforms a 75-ohm input impedance to an 18.75-ohm impedance and the step-up impedance transformer transforms the 18.75-ohm impedance to a 75-ohm output impedance.

7. The power limiter of claim 1, wherein at least one of the step-down and step-up impedance transformers includes:
   (a) a first node;
   (b) a second node;
   (c) a first conductor connected between the first node and the second node; and
   (d) a second conductor connected between the second node and a ground node.

8. The power limiter of claim 7, wherein:
   (a) the first conductor and the second conductor are electromagnetically coupled by one of side coupling and broadside coupling, and
   (b) the first and second conductors are connected in an anti-parallel configuration such that a current passing through the first conductor creates an electromagnetic field in the second conductor that tends to resist current flow through the second conductor.

9. The power limiter of claim 7, wherein the at least one of the step-down and step-up impedance transformers further includes a third conductor and a fourth conductor located in proximity to, and forming a rectangular array with, the first and second conductors, such that:
   (a) the first conductor and the third conductor in the rectangular array are electromagnetically coupled to each other by side coupling, and
   (b) the second and fourth conductors in the rectangular array are electromagnetically coupled to each other by side coupling, and further coupled to the first and third conductors by broadside coupling.

10. The power limiter of claim 9, wherein:
   (a) the third conductor is connected to the first node,
   (b) the third and fourth conductors are connected to each other in a parallel configuration such that a current passing through the third conductor creates an electromagnetic field in the fourth conductor that tends to induce current flow through the fourth conductor, and
   (c) the fourth conductor is connected to ground.

11. The power limiter of claim 7, wherein at least one of the step-down and step-up impedance transformers is disposed in an integrated circuit.

12. The power limiter of claim 11, wherein
(a) the integrated circuit includes a substrate, a ground plane in contact with the substrate, and a dielectric layer, and
(b) the at least one of the step-down and step-up impedance transformers is configured such that (i) the second conductor is in contact with the substrate and (ii) the first conductor is positioned above the second conductor and separated from the second conductor by the dielectric layer.

13. The power limiter of claim 12, wherein the first conductor includes a flange portion that extends to the substrate, thereby improving heat flow from the first conductor to the GaAs substrate.

14. The power limiter of claim 1, wherein the diode limiter and the step-down and step-up impedance transformers are integrated on a single monolithic integrated circuit.

15. The power limiter of claim 1, wherein the power limiter is capable of limiting an input signal having a power of up to 10 watts continuous-wave.

16. The power limiter of claim 1, wherein the power limiter is capable of limiting an input signal having a frequency between about 2 GHz and about 20 GHz.

17. The power limiter of claim 1, further comprising:
(a) a low-noise amplifier connected to the output terminal.

18. A method for limiting the power of an input signal having an input impedance, comprising the steps of:
(a) stepping-down the impedance of the input signal from the input impedance to an intermediate impedance;
(b) shunting a portion of the input signal to ground, while at said intermediate impedance; and
(c) stepping-up the impedance of a remaining portion of the input signal from the intermediate impedance to an output impedance.

19. The power limiter of claim 1, wherein at least the step-down or step-up impedance transformer, comprises:
(a) a first node;
(b) a second node;
(c) a ground node; and
(d) a rectangular array of at least four conductors connected between the first node, the second node, and the ground node, wherein each conductor in the array is electromagnetically coupled to each other conductor in the array by at least one of side-coupling and broadside coupling.

20. The power limiter of claim 19, wherein:
(a) the first conductor and the third conductor in the rectangular array of at least four conductors are electromagnetically coupled to each other by side coupling, and
(b) the second and fourth conductors in the rectangular array are electromagnetically coupled to each other by side coupling, and further coupled to the first and the third conductors by broadside coupling.

21. The power limiter of claim 20, wherein the first and second conductors are connected to each other in an antiparallel configuration such that a current passing through the first conductor creates an electromagnetic field in the second conductor that tends to resist current flow through the second conductor.

22. The power limiter of claim 21, wherein the third and fourth conductors are connected to each other in a parallel configuration such that a current passing through the third conductor creates an electromagnetic field in the fourth conductor that tends to induce current flow through the fourth conductor.

23. The power limiter of claim 22, wherein:
(a) the first node is connected to a first end of the first conductor and to a first end of the third conductor,
(b) the second end of the first conductor is connected to the second node;
(c) the second end of the third conductor is connected to a first end of the second conductor and to a first end of the fourth conductor; and
(d) both the second end of the second conductor and the second end of the fourth conductor are connected to ground.

24. The power limiter of claim 23, wherein the rectangular array provides a 9:4 impedance transformation between the first node and the second node.

25. The power limiter of claim 20, wherein the array of at least four conductors is disposed in an integrated circuit.

26. The power limiter of claim 1, wherein the step-down impedance transfer reduces impedance from a first impedance to a second impedance, and the step-up impedance transformer increases the second impedance back to the first impedance.

27. The method of claim 18, wherein the input impedance and the output impedance are about the same.

* * * * *